(12) United States Patent
Hou et al.

(10) Patent No.: US 8,669,464 B2
(45) Date of Patent: Mar. 11, 2014

(54) THERMOPHOTOVOLTAIC SYSTEM

(75) Inventors: Wen-Chi Hou, Changhua County (TW); Tung-Hsien Wu, Changhua County (TW); Chih-Jui Ni, Taichung County (TW); Chih-Lien Chiang, Yilan County (TW); Chau-Nan Hong, Tainan (TW)

(73) Assignee: National Cheng Kung University, Tainan (TW)

( * ) Notice: Subject to any disclaimer, the term of this patent is extended or adjusted under 35 U.S.C. 154(b) by 720 days.

(21) Appl. No.: 12/960,456

(22) Filed: Dec. 3, 2010

(65) Prior Publication Data

US 2012/0024359 A1 Feb. 2, 2012

(30) Foreign Application Priority Data

Jul. 28, 2010 (TW) .............................. 99124947 A

(51) Int. Cl.
*H01L 31/04* (2006.01)
(52) U.S. Cl.
USPC ............. 136/253; 136/252; 136/254; 438/57; 438/73
(58) Field of Classification Search
USPC ................. 136/244–267; 438/57–98
See application file for complete search history.

(56) References Cited

PUBLICATIONS

Thermophotovoltaic Cogeneration Thermophotovoltaics, Dalarna University, (http://www.du.se/en/About-Dalarna-University/Organisational-Structure/Schools/School-of-Technology-and-Business-Studies/Forskning/Solar-Energy-Research-Center/Projects/Completed-projects/TPV---Thermophotovoltaic-cogenertation-Thermophotovoltaics/) (downloaded Aug. 3, 2013) (2009).*
Solar Thermophotovoltaic Converters: Efficiency Potentialities.
Solar Thermophotovoltaic Converters Based on Tungsten Emitters.
Advances in Gas-Fired Thermophotovoltaic Systems.

* cited by examiner

*Primary Examiner* — Jayne Mershon
(74) *Attorney, Agent, or Firm* — CKC & Partners Co., Ltd.

(57) ABSTRACT

A thermophotovoltaic system is described. The thermophotovoltaic system includes a chamber body, an emitter, a filter and a photovoltaic cell. The chamber body has an ellipsoid chamber including a first focus and a second focus. The emitter is disposed on the first focus, and the emitter is suitable for emitting a plurality of electromagnetic waves. The filter is surrounding the emitter to filter the electromagnetic waves and to pass the electromagnetic waves with a predetermined wavelength band. The photovoltaic cell is disposed on the second focus and is suitable for receiving the electromagnetic waves with the predetermined wavelength band.

10 Claims, 4 Drawing Sheets

THERMOPHOTOVOLTAIC SYSTEM

RELATED APPLICATIONS

This application claims priority to Taiwan Application Serial Number 99124947, filed Jul. 28, 2010, which is herein incorporated by reference.

FIELD OF THE INVENTION

The present invention relates to a thermophotovoltaic (TPV) system, and more particularly to a thermophotovoltaic system having an ellipsoid chamber

BACKGROUND OF THE INVENTION

Generally, a thermophotovoltaic device is a kind of device that can transform radiation generated by a high-temperature heat source into electricity. Generally, the thermophotovoltaic device is operated by burning a fuel to heat an emitter to make the emitter generate light and using a solar cell to receive the light energy and to transform the received light energy into electricity.

Please refer to FIG. 1. FIG. 1 is a schematic diagram showing a conventional thermophotovoltaic device. A thermophotovoltaic device 100 mainly includes an emitter 102 and several solar cells 104. The emitter 102 may be a high temperature resistance cylinder. An interior of the emitter 102 often has a combustion chamber 108. A fuel can be put into the combustion chamber 108 in the interior of the emitter 102, and is burned in the combustion chamber 108 to heat the emitter 102. The solar cells 104 are disposed outside and surrounding the emitter 102.

After the fuel is burned in the combustion chamber 108, the emitter 102 is heated. The emitter 102 is generally heated to a temperature exceeding 1000° C. After being heated, the emitter 102 generates radiation 106. Then, the radiation 106 is emitted toward the solar cells 104 surrounding the emitter 102. The solar cells 104 absorb the radiation 106 emitted by the emitter 102 and transform the light energy into electricity.

However, in the conventional thermophotovoltaic device 100, many solar cells are needed and disposed surrounding the emitter 102 to collect the radiation 106 emitted by the emitter 102 in the periphery of the emitter 102. Therefore, when the thermophotovoltaic device 100 is prepared, a lot of materials of the solar cells 104 are needed, so that the fabrication cost is very high, thereby being unfavorable to mass production.

SUMMARY OF THE INVENTION

Therefore, one aspect of the present invention is to provide a thermophotovoltaic system, which includes a chamber body having an ellipsoid chamber. By disposing an emitter on a first focus of the ellipsoid chamber, and disposing the photovoltaic cell on a second focus of the ellipsoid chamber, after being reflected by an inner wall of the ellipsoid chamber, electromagnetic waves emitted by the emitter can focus on the photovoltaic cell on the other focus. Therefore, the photovoltaic cell can absorb the electromagnetic waves emitted by the emitter effectively, thereby increasing the utilization efficiency of the electromagnetic waves emitted by the emitter.

Another aspect of the present invention is to provide a thermophotovoltaic system including a filter. The filter can filter electromagnetic waves with predetermined wavelengths, so that the absorption efficiency of the electromagnetic wave of a photovoltaic cell is greatly increased, thereby enhancing the efficiency of the photovoltaic cell.

Still another aspect of the present invention is to provide a thermophotovoltaic system, in which its chamber body has an ellipsoid chamber, an emitter is disposed on one focus of the ellipsoid chamber, and a filter is disposed on the other focus of the ellipsoid chamber. Hence, after being reflected by an inner wall of the ellipsoid chamber, electromagnetic waves emitted by the emitter can focus on the filter on the other focus. The electromagnetic waves passing through the filter are transmitted to a photovoltaic cell through a waveguide. Therefore, the photovoltaic cell can absorb the electromagnetic waves emitted by the emitter effectively, thereby increasing the utilization efficiency of the electromagnetic waves, and enhancing the electricity generating efficiency of the thermophotovoltaic system.

Yet another aspect of the present invention is to provide a thermophotovoltaic system, in which its ellipsoid chamber can make a photovoltaic cell effectively collect electromagnetic waves emitted by an emitter. Hence, it does not need a large number of photovoltaic cells to surround the emitter for collecting the electromagnetic waves, so that the cost is greatly decreased.

According to the aforementioned objectives, the present invention provides a thermophotovoltaic system, including a chamber body, an emitter, a filter and a photovoltaic cell. The chamber body has an ellipsoid chamber including a first focus and a second focus. The emitter is disposed on the first focus, and the emitter is suitable for emitting a plurality of electromagnetic waves. The filter is surrounding the emitter to filter the electromagnetic waves and to pass the electromagnetic waves with a predetermined wavelength band. The photovoltaic cell is disposed on the second focus and is suitable for receiving the electromagnetic waves with the predetermined wavelength band.

According to a preferred embodiment of the present invention, the thermophotovoltaic system further includes a reflective layer covering a surface of the ellipsoid chamber.

According to another preferred embodiment of the present invention, a pressure of the ellipsoid chamber is between 760 torrs and $1 \times 10^{-3}$ torrs, for example.

According to still another preferred embodiment of the present invention, a material of the filter may be quartz glass, one dimensional photonic crystal composed of silicon/silicon dioxide, an aqueous layer or tin dioxide. Furthermore, a material of the emitter may be ZrO, SiC, nichrome wire, ZnO, $Al_2O_3/SiO_2$, ceramic blankets, tungsten (W), quartz or $MoSi_2$.

According to yet another preferred embodiment of the present invention, the emitter includes a combustion chamber, the chamber body includes a through hole, a fuel can be delivered into the combustion chamber through the through hole, the fuel can be burned to heat the emitter, and the fuel may be alkane, acetylene, alcohol or coal.

According to further another preferred embodiment of the present invention, the chamber body includes a through hole, the thermophotovoltaic system further includes a condenser device outside the chamber body, and the condenser device can focus a light source outside the chamber body on the emitter through the through hole to heat the emitter.

According to the aforementioned objectives, the present invention further provides a thermophotovoltaic system, including a chamber body, an emitter, a filter, a photovoltaic cell and a waveguide. The chamber body has an ellipsoid chamber including a first focus and a second focus. The emitter is disposed on the first focus, wherein the emitter is suitable for emitting a plurality of electromagnetic waves.

The filter is disposed on the second focus to filter the electromagnetic waves and to pass the electromagnetic waves with a predetermined wavelength band. The photovoltaic cell is disposed outside the chamber body and is suitable for receiving the electromagnetic waves with the predetermined wavelength band. The waveguide passes through the chamber body and is connected between the filter and the photovoltaic cell to transmit the electromagnetic waves with the predetermined wavelength band passing through the filter to the photovoltaic cell.

According to a preferred embodiment of the present invention, the thermophotovoltaic system further includes a reflective layer covering a surface of the ellipsoid chamber, and a pressure of the ellipsoid chamber is between 760 torrs and $1\times10^{-3}$ torrs.

According to another preferred embodiment of the present invention, the emitter includes a combustion chamber, the chamber body includes a through hole, a fuel can be delivered into the combustion chamber through the through hole, the fuel can be burned to heat the emitter, and the fuel is alkane, acetylene, alcohol or coal, for example.

According to still another preferred embodiment of the present invention, the chamber body includes a through hole, the thermophotovoltaic system further includes a condenser device disposed outside the chamber body, and the condenser device can focus a light source outside the chamber body on the emitter through the through hole to heat the emitter.

According to yet another preferred embodiment of the present invention, a material of the filter may be quartz glass, one dimensional photonic crystal composed of silicon/silicon dioxide, an aqueous layer or tin dioxide. Furthermore, a material of the emitter may be ZrO, SiC, nichrome wire, ZnO, $Al_2O_3/SiO_2$, ceramic blankets, W, quartz or $MoSi_2$.

With the application of the thermophotovoltaic system of the present invention, the efficiency of the photovoltaic cell for collecting the electromagnetic waves emitted by the emitter is increased, thereby enhancing the electricity generating efficiency. Furthermore, the thermophotovoltaic system of the present invention does not need a large number of photovoltaic cells to surround the emitter, so that the fabrication cost is low.

BRIEF DESCRIPTION OF THE DRAWINGS

The foregoing aspects and many of the attendant advantages of this invention are more readily appreciated as the same become better understood by reference to the following detailed description, when taken in conjunction with the accompanying drawings, wherein.

DETAILED DESCRIPTION OF THE PREFERRED EMBODIMENT

Figure 1:
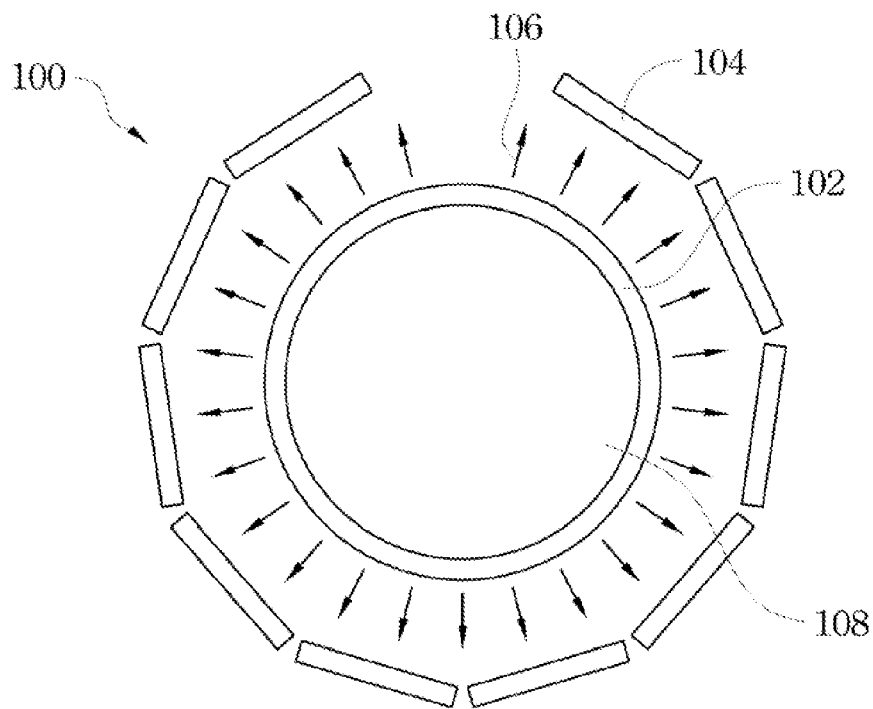
FIG. 1 is a schematic diagram showing a conventional thermophotovoltaic device.
Figure 2:
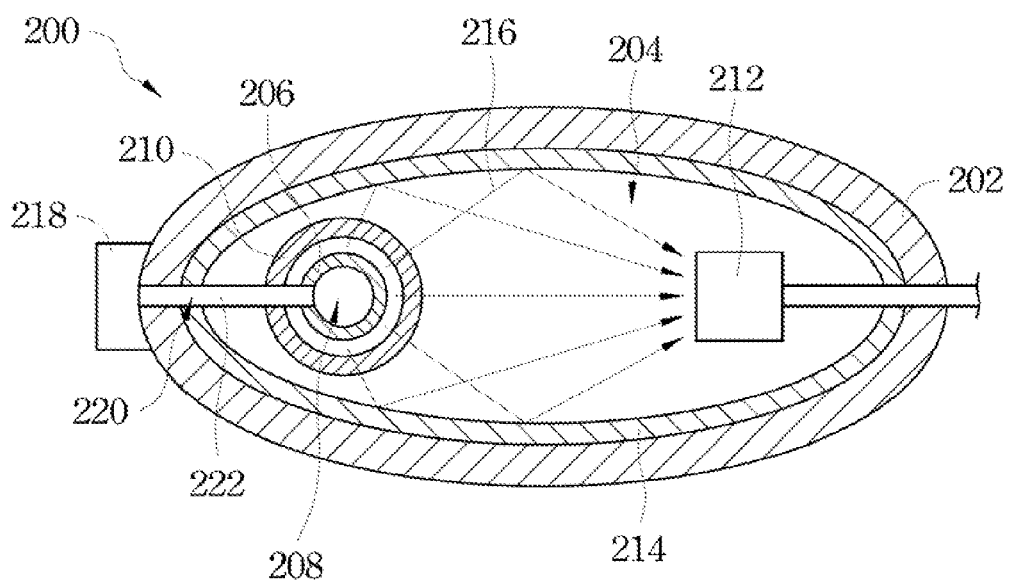
FIG. 2 illustrates a cross-sectional view of a thermophotovoltaic system in accordance with an embodiment of the present invention.
Figure 3:
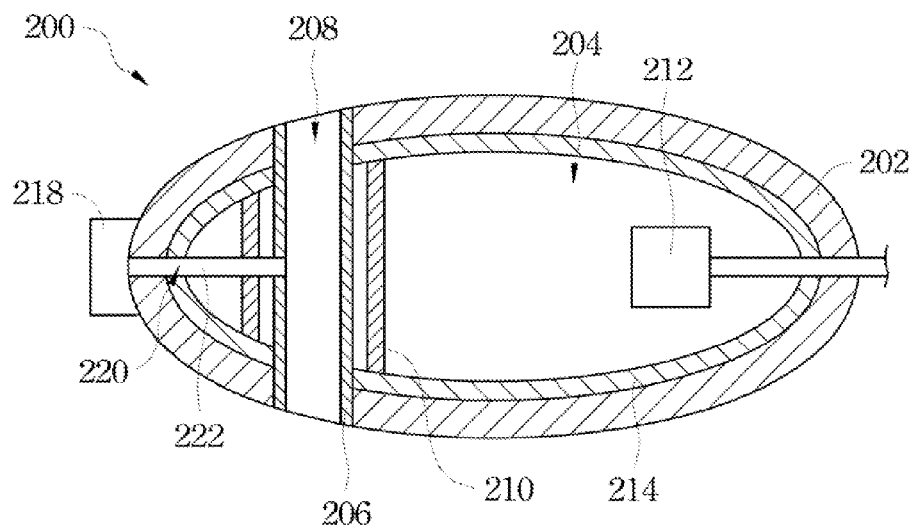
FIG. 3 illustrates another cross-sectional view of a thermophotovoltaic system in accordance with an embodiment of the present invention.

Please refer to FIG. 2 and FIG. 3. FIG. 2 and FIG. 3 illustrate cross-sectional views of a thermophotovoltaic system along two directions in accordance with an embodiment of the present invention. In the embodiment, a thermophotovoltaic system 200 mainly includes a chamber body 202, an emitter 206, a filter 210 and a photovoltaic cell 212. The chamber body 202 is an ellipsoid structure, for example. A material of the chamber body 202 may use easy process stainless steel. The chamber body 202 has an ellipsoid chamber 204. Hence, it is known that the ellipsoid chamber 204 has two focuses. In one embodiment, a pressure of the ellipsoid chamber 204 is between 760 torrs and $1\times10^{-3}$ torrs, for example.

In the embodiment shown in FIG. 2 and FIG. 3, the chamber body 202 is an ellipsoid structure. However, in another embodiment, the chamber body can be a non-ellipsoid structure having an ellipsoid chamber.

The emitter 206 is disposed on one focus of the ellipsoid chamber 204 of the chamber body 202. In one embodiment, after being heated, the emitter 206 can emit many electromagnetic waves 216. A high temperature resistance material may be used to form the emitter 206. In one embodiment, the material of the emitter 206 is ZrO, SiC, nichrome wire, ZnO, $Al_2O_3/SiO_2$, ceramic blankets, W, quartz or $MoSi_2$, for example.

In addition, an interior of the emitter 206 may include a combustion chamber 208, wherein a fuel can be burned within the combustion chamber 208 to heat the emitter 206. In one embodiment, a fuel 218 used in the thermophotovoltaic system 200 may be alkane, acetylene, alcohol or coal. In one embodiment, such as the embodiment shown in FIG. 2 and FIG. 3, the chamber body 202 may include a through hole 220 and a delivery pipe 222, wherein the delivery pipe 222 extends from the through hole 220 to the combustion chamber 208. The fuel 218 can be delivered into the combustion chamber 208 within the emitter 206 through the through hole 220 and the delivery pipe 222.

The filter 210 is disposed outside and surrounding the emitter 206. The filter 210 can filter the electromagnetic waves 216 emitted by the emitter 206 to pass the electromagnetic waves 216 with a predetermined wavelength band among the electromagnetic waves 216 emitted by the emitter 206. The photovoltaic cell 212 can effectively transform the electromagnetic waves 216 with the predetermined wavelength band into electricity. In one embodiment, a material of the filter 210 may be quartz glass, one dimensional photonic crystal composed of silicon/silicon dioxide, an aqueous layer or tin dioxide.

The photovoltaic cell 212 is disposed on the other focus of the ellipsoid chamber 204 of the chamber body 202. The photovoltaic cell 212 is a solar cell, for example. The photovoltaic cell 212 can be used to receive the electromagnetic waves 216 with the predetermined wavelength band that are filtered and emitted from the filter 210. After receiving the electromagnetic waves 216 with the predetermined wavelength band, the photovoltaic cell 212 can transform the light energy of the electromagnetic waves 216 into electricity, and transmit the electricity to the outer of the chamber body 202 for use. In one embodiment, a material of the photovoltaic cell 212 may be GaSb, GaAs, Si, InN or InGaN.

In one embodiment, the chamber body 202 may be made of a high reflectivity material. Hence, it is unnecessary to additionally coat a reflective material on a surface of the ellipsoid chamber 204 of the chamber body 202. In another embodiment, such as the embodiment shown in FIG. 2 and FIG. 3, the thermophotovoltaic system 200 further includes a reflective layer 214. The reflective layer 214 covers the surface of the ellipsoid chamber 204 of the chamber body 202 for reflecting the electromagnetic waves 216 emitted by the emitter 206 and filtered by the filter 210. In one example, a material of the reflective layer 214 may be Au or TiN.

In the thermophotovoltaic system 200, the fuel 218 is burned within the combustion chamber 208 within the emitter 206 to heat the emitter 206. After the emitter 206 is heated to a specific temperature, the emitter 206 emits the electromagnetic waves 216. After the electromagnetic waves 216 are filtered by the filter 210 surrounding the emitter 206, the electromagnetic waves 216 with the predetermined wavelength band emit toward the surface of the ellipsoid chamber 204 of the chamber body 202. Because the emitter 206 is disposed on one focus of the ellipsoid chamber 204, after the electromagnetic waves 216 are emitted from the emitter 206, pass through the surrounding filter 210, and are reflected by the surface of the ellipsoid chamber 204 or the reflective layer 214 on the surface of the ellipsoid chamber 204, the electromagnetic waves 216 can focus on the photovoltaic cell 212 on the other focus of the ellipsoid chamber 204. The photovoltaic cell 212 can transform the light energy of the received electromagnetic waves 216 into electricity, and transmit the electricity to the outer of the thermophotovoltaic system 200 for use.

Because the emitter 206 and the photovoltaic cell 212 are respectively disposed on the two focuses of the ellipsoid chamber 204, the electromagnetic waves 216 emitted by the emitter 206 can be effectively absorbed by the photovoltaic cell 212. Hence, the amount of the photovoltaic cell 212 is decreased, thereby greatly reducing the fabrication cost of the thermophotovoltaic system 200.

Figure 4:
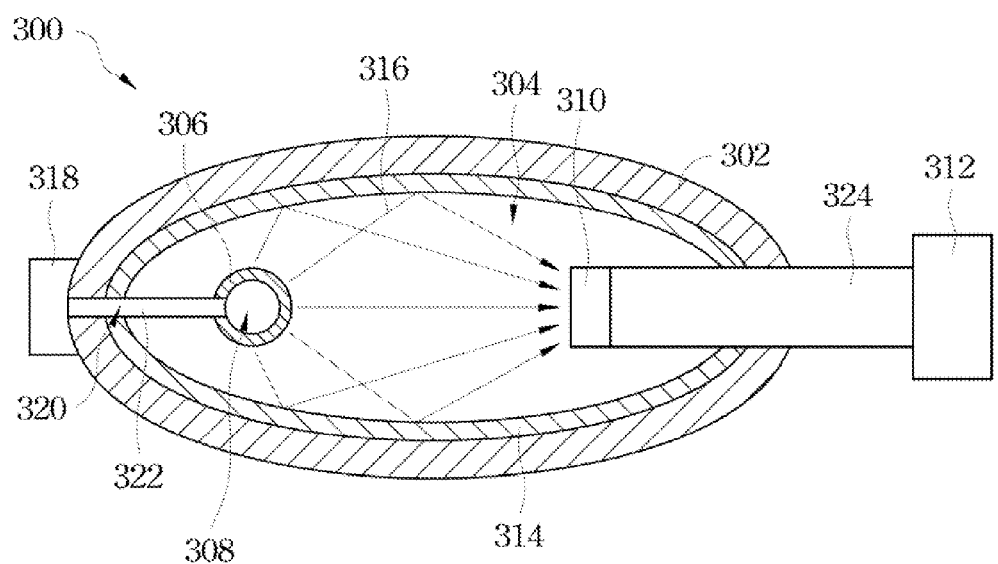
FIG. 4 illustrates a cross-sectional view of a thermophotovoltaic system in accordance with another embodiment of the present invention.

In the present invention, the photovoltaic cell may be disposed outside the chamber body. Please refer to FIG. 4. FIG. 4 illustrates a cross-sectional view of a thermophotovoltaic system in accordance with another embodiment of the present invention. In the embodiment, a thermophotovoltaic system 300 mainly includes a chamber body 302, an emitter 306, a filter 310, a photovoltaic cell 312 and a waveguide 324. The chamber body 302 is an ellipsoid structure, for example. A material of the chamber body 302 may use an easy process material, such as stainless steel. The chamber body 302 has an ellipsoid chamber 304. Hence, it is known that the ellipsoid chamber 304 has two focuses. In one embodiment, a pressure of the ellipsoid chamber 304 is between 760 torrs and $1 \times 10^{-3}$ torrs, for example.

In one embodiment, the chamber body 302 is an ellipsoid structure. However, in another embodiment, the chamber body can be a non-ellipsoid structure having an ellipsoid chamber.

Similarly, the emitter 306 is disposed on one focus of the ellipsoid chamber 304 of the chamber body 302. After being heated, the emitter 306 can emit many electromagnetic waves 316. A high temperature resistance material may be used to form the emitter 306. In one embodiment, the material of the emitter 306 is ZrO, SiC, nichrome wire, ZnO, $Al_2O_3/SiO_2$, ceramic blankets, W, quartz or $MoSi_2$, for example.

In the embodiment, an interior of the emitter 306 may include a combustion chamber 308. A fuel can be burned within the combustion chamber 308 to heat the emitter 306. In one embodiment, a fuel 318 used in the thermophotovoltaic system 300 may be alkane, acetylene, alcohol or coal. The chamber body 302 may include a through hole 320 and a delivery pipe 322, wherein the delivery pipe 322 extends from the through hole 320 to the combustion chamber 308. The fuel 318 can be delivered into the combustion chamber 308 within the emitter 306 through the through hole 320 and the delivery pipe 322.

In the embodiment, the filter 310 is disposed on the other focus of the ellipsoid chamber 304 of the chamber body 302. The filter 310 can filter the electromagnetic waves 316 emitted by the emitter 306 to pass the electromagnetic waves 316 with a predetermined wavelength band among the electromagnetic waves 316 emitted by the emitter 306. The photovoltaic cell 312 can effectively transform the electromagnetic waves 316 with the predetermined wavelength band into electricity. A material of the filter 210 may be quartz glass, one dimensional photonic crystal composed of silicon/silicon dioxide, an aqueous layer or tin dioxide. A material of the filter 310 may be quartz glass, one dimensional photonic crystal composed of silicon/silicon dioxide, an aqueous layer or tin dioxide.

The photovoltaic cell 312 is disposed outside the chamber body 302. The photovoltaic cell 312 is a solar cell, for example. The photovoltaic cell 312 can be used to receive the electromagnetic waves 316 with the predetermined wavelength band that are filtered and emitted from the filter 310. In one embodiment, a material of the photovoltaic cell 312 may be GaSb, GaAs, Si, InN or InGaN.

The waveguide 324 passes through the chamber body 302 and is connected between the filter 310 and the photovoltaic cell 312. With the waveguide 324, the electromagnetic waves 316 with the predetermined wavelength band filtered by the filter 310 can be transmitted to the photovoltaic cell 312 outside the chamber body 302.

The chamber body 302 may be made of a high reflectivity material, so that it is unnecessary to additionally coat a reflective material on a surface of the ellipsoid chamber 304 of the chamber body 302. As shown in FIG. 4, in another embodiment, the thermophotovoltaic system 300 further includes a reflective layer 314. The reflective layer 314 covers the surface of the ellipsoid chamber 304 of the chamber body 302 for reflecting the electromagnetic waves 316 emitted by the emitter 306. In one example, a material of the reflective layer 314 may be Au or TiN.

In the thermophotovoltaic system 300, the fuel 318 is burned within the combustion chamber 308 within the emitter 306 to heat the emitter 306. After the emitter 306 is heated to a specific temperature, the emitter 306 emits the electromagnetic waves 316. The electromagnetic waves 316 emit toward the surface of the ellipsoid chamber 304 of the chamber body 302. Because the emitter 306 is disposed on one focus of the ellipsoid chamber 304, after the electromagnetic waves 316 are emitted from the emitter 306 and reflected by the surface of the ellipsoid chamber 304 or the reflective layer 314 on the surface of the ellipsoid chamber 304, the electromagnetic waves 316 can focus on the filter 310 on the other focus of the ellipsoid chamber 304. The electromagnetic waves 316 with the predetermined wavelength band filtered by the filter 310 can be transmitted to the photovoltaic cell 312 outside the chamber body 302 through waveguide 324. The photovoltaic cell 312 can transform the light energy of the received electromagnetic waves 316 into electricity for use.

Because the emitter 306 and the filter 310 are respectively disposed on the two focuses of the ellipsoid chamber 304, the electromagnetic waves 316 emitted by the emitter 306 can be effectively gathered on the filter 310, and can be effectively absorbed by the photovoltaic cell 312 through the transmission of the waveguide 324. Hence, the energy conversion efficiency of the thermophotovoltaic system 300 is increased, and the amount of the photovoltaic cell 312 is decreased, thereby greatly reducing the fabrication cost of the thermophotovoltaic system 300.

Figure 5:
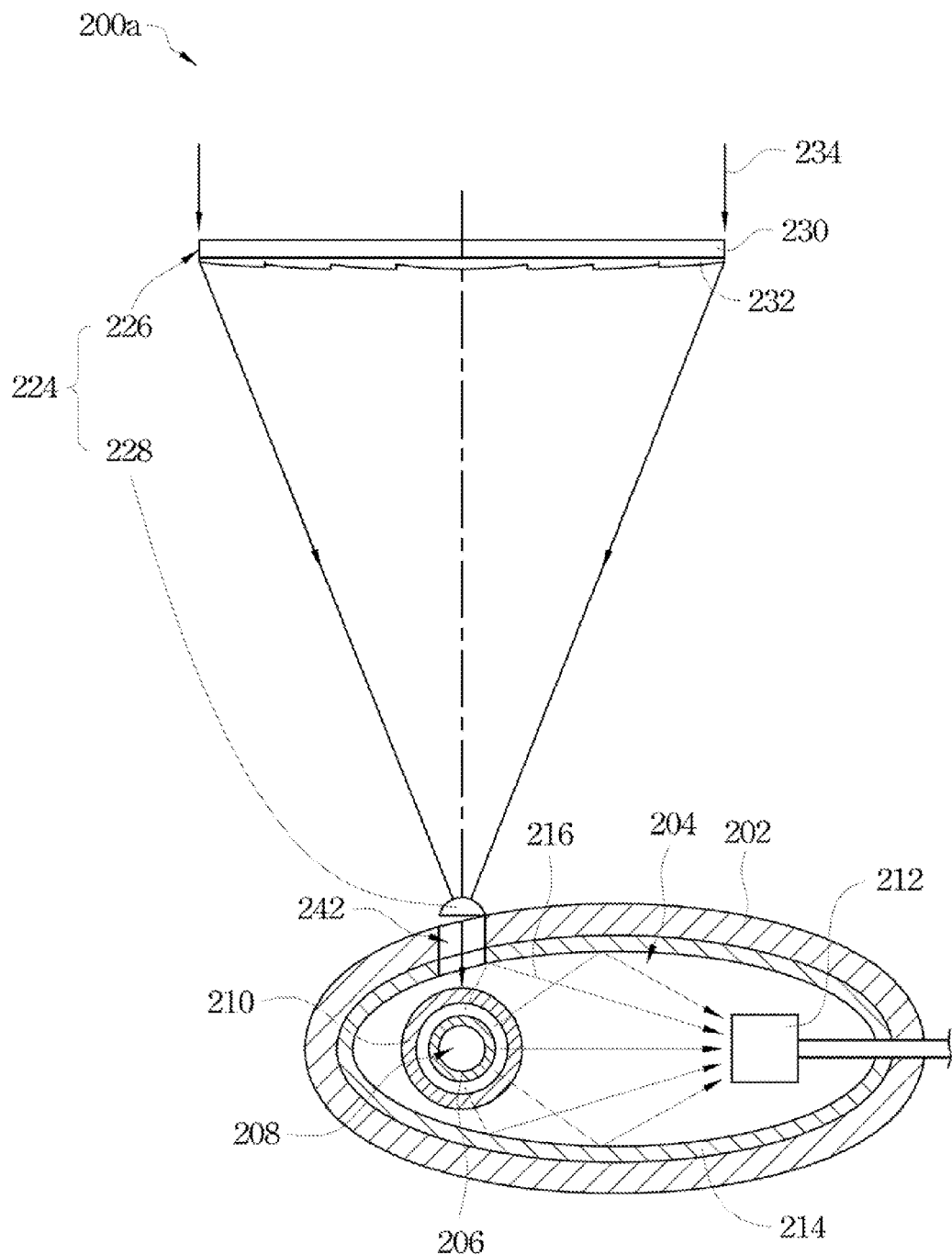
FIG. 5 illustrates a cross-sectional view of a thermophotovoltaic system in accordance with still another embodiment of the present invention.

The thermophotovoltaic system of the present invention can heat the emitter by a light condensing method, such as a solar energy condensing method. Please refer to FIG. 5. FIG. 5 illustrates a cross-sectional view of a thermophotovoltaic system in accordance with still another embodiment of the present invention. In the embodiment, a heating method used by a thermophotovoltaic system 200a is different from those used by the thermophotovoltaic systems 200 and 300 in the aforementioned embodiments. The thermophotovoltaic system 200a heats the emitter by a light condensing method.

In the embodiment, the thermophotovoltaic system 200a includes a condenser device 224. The condenser device 224 is disposed outside the chamber body 202. The installation within the chamber body 202 of the thermophotovoltaic system 200a is similar to that within the chamber body 202 of the thermophotovoltaic system 200. The differences between the thermophotovoltaic systems 200a and 200 are that the thermophotovoltaic system 200a does not have the fuel 218, the through hole 220 and the delivery pipe 222, and the thermophotovoltaic systems 200a has a through hole 242 for an incident light to enter the chamber body 202 to heat the emitter 210.

In one embodiment, the condenser device 224 may include a lens device 226 and a secondary lens 228, wherein the lens 226 and the secondary lens 228 are separated by a predetermined distance. As shown in FIG. 5, in comparison with the lens device 226, the secondary lens 228 is closer to the chamber body 202. The lens device 226 includes an upper panel 230 and a lens layer 232, wherein the lens layer 232 is disposed on a surface of the upper panel 230. A material of the upper panel 230 may be silicate glass, and a material of the lens layer 232 may be silicone. In one example, the lens layer 232 may be a Fresnel lens.

In the thermophotovoltaic system 200a, a light source, such as sunlight 234, passes through the upper panel 230 and the lens layer 232 of the lens device 226 in sequence, so that a condenser effect is formed. The condensed sunlight 234 gathers on the secondary lens 228, and is condensed by the secondary lens 228, so as to make the sunlight 234 project toward the emitter 206 through the through hole 242 of the chamber body 202 to heat the emitter 206.

Because the light source outside the chamber body 202 can be condensed by the condenser device 224 and can project to the emitter 206 within the chamber body 202 to heat the emitter 206, the thermophotovoltaic system 200a has advantages of energy-saving, environmental protection and economy.

Figure 6:
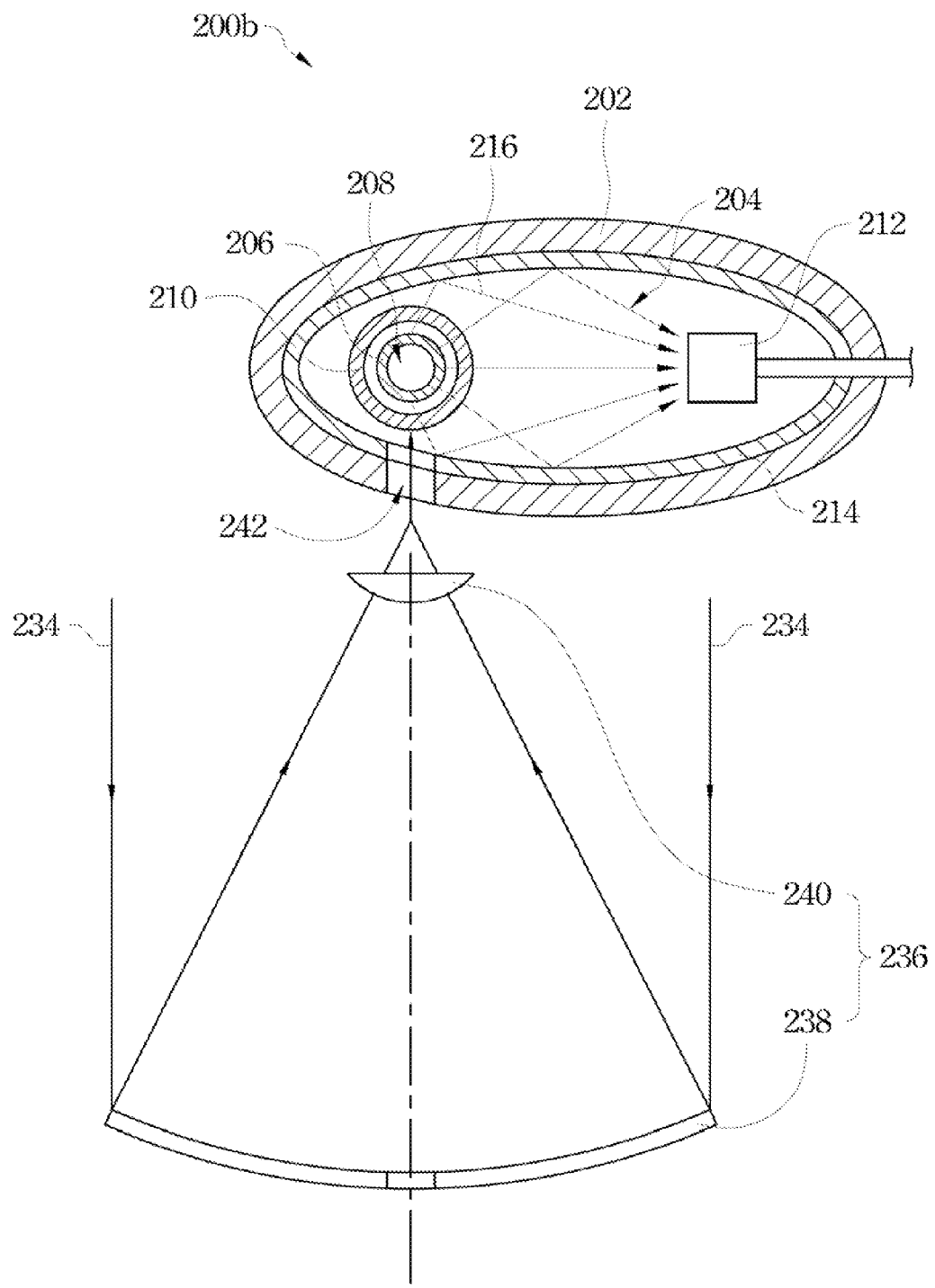
FIG. 6 illustrates a cross-sectional view of a thermophotovoltaic system in accordance with yet another embodiment of the present invention.

Please refer to FIG. 6. FIG. 6 illustrates a cross-sectional view of a thermophotovoltaic system in accordance with yet another embodiment of the present invention. In the embodiment, a heating method used by a thermophotovoltaic system 200b is the same as that used by the thermophotovoltaic system 200a, wherein both of the thermophotovoltaic system 200b and 200a heat the emitters by a light condensing method.

In the embodiment, the thermophotovoltaic system 200b includes a condenser device 236. The condenser device 236 is disposed outside the chamber body 202 similarly. In addition, the installation within the chamber body 202 of the thermophotovoltaic system 200b is the same as that within the chamber body 202 of the thermophotovoltaic system 200a. The difference between the thermophotovoltaic systems 200b and 200a is that the condenser devices of the thermophotovoltaic systems 200b and 200a are different.

In the embodiment, the condenser device 236 may include a dish mirror 238 and a secondary lens 240, wherein the dish mirror 238 and the secondary lens 240 are separated by a predetermined distance. As shown in FIG. 6, in comparison with the dish mirror 238, the secondary lens 240 is closer to the chamber body 202.

In the thermophotovoltaic system 200b, a light source, such as sunlight 234, projects on the dish mirror 238, and the dish mirror 238 reflects the incident sunlight 234 and makes the reflected sunlight 234 gather on the secondary lens 240. After the incident sunlight 234 projecting on the secondary lens 240 is condensed by the secondary lens 240, the sunlight 234 projects toward the emitter 206 through the through hole 242 of the chamber body 202 to heat the emitter 206.

Similarly, because the light source outside the chamber body 202 can be condensed by the condenser device 236 and can project to the emitter 206 within the chamber body 202 to heat the emitter 206, the thermophotovoltaic system 200b also has advantages of energy-saving, environmental protection and economy.

Although the installation of the chamber bodies of the thermophotovoltaic systems 200a and 200b is the same as that of the chamber body of the thermophotovoltaic system 200, the installation of the chamber bodies of the thermophotovoltaic systems in the aforementioned embodiments may be the same as that of the chamber body of the thermophotovoltaic system 300.

In the present invention, the heating method of the thermophotovoltaic device can combine the heating method of burning the fuel and the light condensing method in the aforementioned embodiments to increase the heating efficiency for the emitter.

According to the aforementioned embodiments of the present invention, one advantage of the present invention is that a thermophotovoltaic system of the present invention includes a chamber body having an ellipsoid chamber. By disposing an emitter on a first focus of the ellipsoid chamber, and disposing the photovoltaic cell on a second focus of the ellipsoid chamber, after being reflected by an inner wall of the ellipsoid chamber, electromagnetic waves emitted by the emitter can focus on the photovoltaic cell on the other focus. Therefore, the photovoltaic cell can absorb the electromagnetic waves emitted by the emitter effectively, thereby increasing the utilization efficiency of the electromagnetic waves emitted by the emitter.

According to the aforementioned embodiments of the present invention, another advantage of the present invention is that a thermophotovoltaic system of the present invention includes a filter, which can filter electromagnetic waves with predetermined wavelengths. Hence, the absorption efficiency of the electromagnetic wave of a photovoltaic cell is greatly increased, thereby enhancing the efficiency of the photovoltaic cell.

According to the aforementioned embodiments of the present invention, still another advantage of the present invention is that a chamber body of a thermophotovoltaic system of the present invention has an ellipsoid chamber, an emitter is disposed on one focus of the ellipsoid chamber, and a filter is disposed on the other focus of the ellipsoid chamber. Hence, after being reflected by an inner wall of the ellipsoid chamber, electromagnetic waves emitted by the emitter can focus on the filter on the other focus. The electromagnetic waves passing through the filter are transmitted to a photovoltaic cell through a waveguide. Therefore, the photovoltaic cell can absorb the electromagnetic waves emitted by the emitter effectively, thereby increasing the utilization efficiency of the electromagnetic waves, and enhancing the electricity generating efficiency of the thermophotovoltaic system.

According to the aforementioned embodiments of the present invention, yet another advantage of the present invention is that an ellipsoid chamber of a thermophotovoltaic system of the present invention can make a photovoltaic cell effectively collect electromagnetic waves emitted by an emitter. Hence, it does not need a large number of photovoltaic cells to surround the emitter for collecting the electromagnetic waves, so that the cost is greatly decreased.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A thermophotovoltaic system, including:
   a chamber body having an ellipsoid chamber including a first focus and a second focus;
   an emitter disposed on the first focus, wherein the emitter is suitable for emitting a plurality of electromagnetic waves;
   a filter disposed on and surrounding the emitter to filter the electromagnetic waves and to pass the electromagnetic waves with a predetermined wavelength band; optional intervening layers between the emitter and the filter; and
   a photovoltaic cell disposed on the second focus and being suitable for receiving the electromagnetic waves with the predetermined wavelength band.

2. The thermophotovoltaic system according to claim 1, further including a reflective layer covering a surface of the ellipsoid chamber.

3. The thermophotovoltaic system according to claim 1, wherein a pressure of the ellipsoid chamber is between 760 torrs and $1\times10^{-3}$ torrs.

4. The thermophotovoltaic system according to claim 1, wherein a material of the filter is quartz glass, one dimensional photonic crystal composed of silicon/silicon dioxide, an aqueous layer or tin dioxide.

5. The thermophotovoltaic system according to claim 1, wherein the emitter includes a combustion chamber, the chamber body includes a through hole, a fuel can be delivered into the combustion chamber through the through hole, the fuel can be burned to heat the emitter, and the fuel is alkane, acetylene, alcohol or coal.

6. The thermophotovoltaic system according to claim 1, wherein the chamber body includes a through hole, the thermophotovoltaic system further includes a condenser device outside the chamber body, and the condenser device can focus a light source outside the chamber body on the emitter through the through hole to heat the emitter.

7. A thermophotovoltaic system, including:
   a chamber body having an ellipsoid chamber including a first focus and a second focus;
   an emitter disposed on the first focus, wherein the emitter is suitable for emitting a plurality of electromagnetic waves;
   a filter disposed on the second focus to filter the electromagnetic waves and to pass the electromagnetic waves with a predetermined wavelength band;
   a photovoltaic cell disposed outside the chamber body and being suitable for receiving the electromagnetic waves with the predetermined wavelength band; and
   a waveguide passing through the chamber body and connected between the filter and the photovoltaic cell to transmit the electromagnetic waves with the predetermined wavelength band passing through the filter to the photovoltaic cell.

8. The thermophotovoltaic system according to claim 7, further including a reflective layer covering a surface of the ellipsoid chamber, and a pressure of the ellipsoid chamber being between 760 torrs and $1\times10^{-3}$ torrs.

9. The thermophotovoltaic system according to claim 7, wherein the emitter includes a combustion chamber, the chamber body includes a through hole, a fuel can be delivered into the combustion chamber through the through hole, the fuel can be burned to heat the emitter, and the fuel is alkane, acetylene, alcohol or coal.

10. The thermophotovoltaic system according to claim 7, wherein the chamber body includes a through hole, the thermophotovoltaic system further includes a condenser device disposed outside the chamber body, and the condenser device can focus a light source outside the chamber body on the emitter through the through hole to heat the emitter.

* * * * *